United States Patent [19]
Daoud

[11] Patent Number: 6,060,665
[45] Date of Patent: May 9, 2000

[54] GROOVED PATHS FOR PRINTED WIRING BOARD WITH OBSTRUCTIONS

[75] Inventor: Bassel Hage Daoud, Parsippany, N.J.

[73] Assignee: Lucent Technologies Inc., Murray Hill, N.J.

[21] Appl. No.: 09/039,488

[22] Filed: Mar. 16, 1998

[51] Int. Cl.[7] .................................................. H05K 1/00
[52] U.S. Cl. ..................... 174/250; 174/253; 174/261; 361/777; 361/760; 257/618
[58] Field of Search ..................... 174/250, 253, 174/261; 361/777, 748, 760; 257/618

[56] References Cited

U.S. PATENT DOCUMENTS

| | | | |
|---|---|---|---|
| 5,110,298 | 5/1992 | Dorinski et al. ........................ | 439/65 |
| 5,286,926 | 2/1994 | Kimura et al. ........................ | 174/250 |
| 5,286,927 | 2/1994 | Ueno et al. ........................... | 174/257 |
| 5,451,722 | 9/1995 | Gregoire ............................... | 174/261 |
| 5,459,287 | 10/1995 | Swamy ................................. | 174/266 |
| 5,754,411 | 5/1998 | Woychik ............................... | 361/803 |
| 5,764,119 | 6/1998 | Miyagi et al. ......................... | 333/238 |

*Primary Examiner*—Kristine Kincaid
*Assistant Examiner*—Dhiru R Patel

[57] ABSTRACT

A printed wiring board employing a grooved path conductive lead configuration. The printed wiring board is formed on a substrate having a surface area. Grooved paths having side walls are formed in the substrate and the sidewalls are coated with a conductive material to form a conductive lead for carrying an electronic signal. The grooved path leads permit closer spacing between adjacent lead pairs without increasing crosstalk between the lead pairs. The grooved path leads also accommodate the inclusion of obstructions such as mounting areas on the substrate because the spacing between adjacent grooved path leads can be condensed without increasing crosstalk levels.

5 Claims, 3 Drawing Sheets

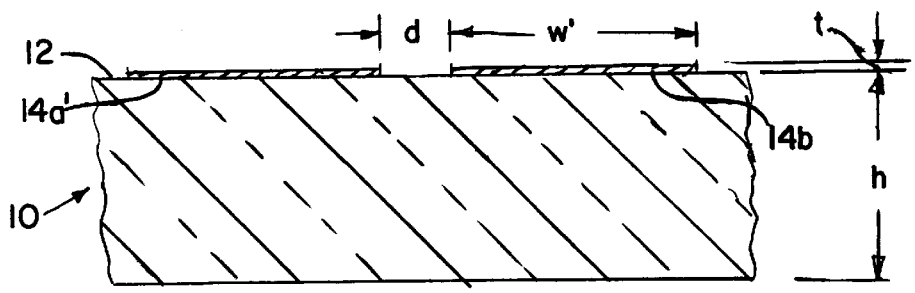
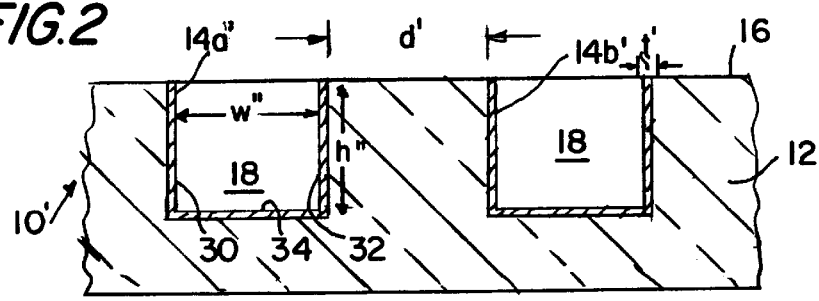
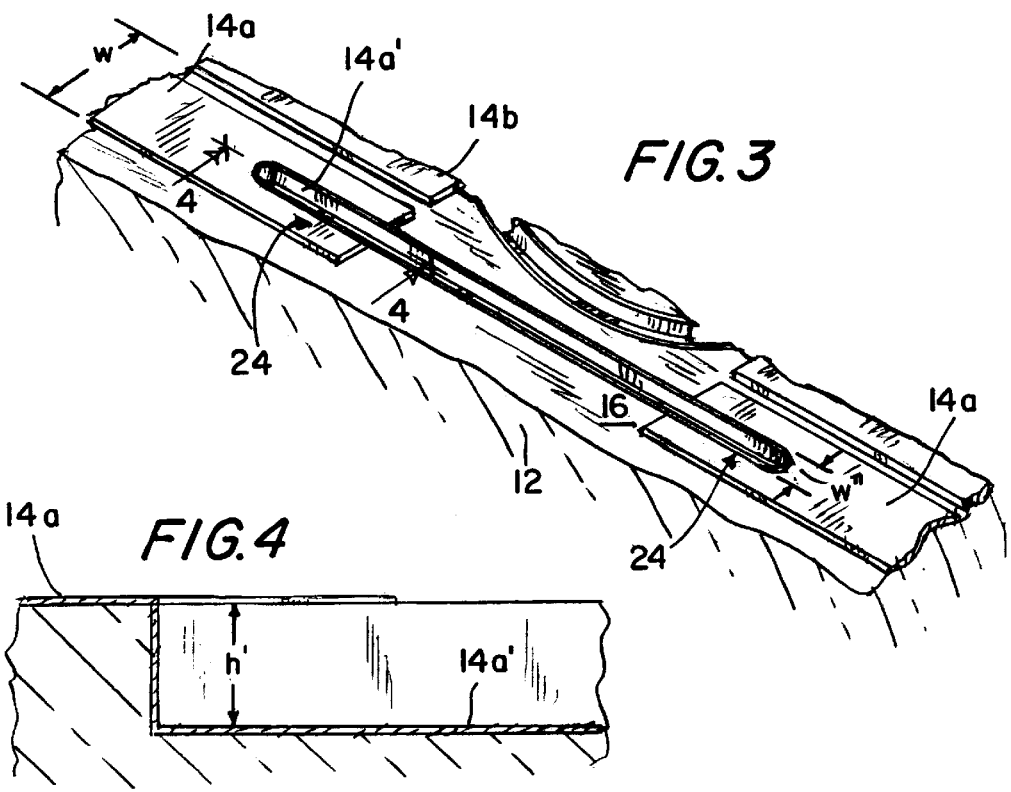

GROOVED PATHS FOR PRINTED WIRING BOARD WITH OBSTRUCTIONS

BACKGROUND OF THE INVENTION

I. Field of the Invention

The present invention pertains to the design of printed wiring boards (PWB) and, specifically, to the layout of conductor leads on PWBs to minimize crosstalk and accommodate obstructions.

II. Description of the Related Art

PWBs are widely used in data communications systems and are typically formed on an insulating or non-conducting substrate, such as plastic, having a width and an upper surface. The upper surface of the substrate supports leads or traces formed of a conducting material, such as aluminum, which carry electrical signals across the PWB. The leads may direct the electrical signals to various components, such as transistors, processors, etc., formed on the PWB.

In communications systems, such as telecommunications systems, the metallic leads are grouped in Tip/Ring pairs and carry signals to and from terminal device equipment connected to the PWB. Due to design considerations and size constraints, adjacent lead pairs are placed in close proximity to each other on the substrate surface to accommodate a large number of lead pairs on a common substrate. As a result of such positioning, crosstalk between adjacent conductive leads can result. For many applications, crosstalk on a PWB may be within tolerable limits. When the distance between adjacent lead pairs is further reduced to accommodate an obstruction included on the PWB surface, however, such reduction often increases the level of detrimental crosstalk beyond tolerable limits. Accordingly, a PWB design is needed for accommodating placement of obstructions on a PWB without sufficiently increasing crosstalk between adjacent lead pairs.

SUMMARY OF THE INVENTION

The present invention relates to printed wiring boards (PWB) for use in communications systems. The inventive PWB is formed on a substrate having a surface area and a thickness. Grooves or channels having sidewalls are formed in the substrate and at least one of the sidewalls are coated with a conducting material to define channel leads that function as a lead for carrying an electronic signal through and along the length of the channel. By selectively employing such channel leads in lieu of at least some of the surface mounted leads, the spacing between adjacent leads can be effectively increased while still maintaining lead density on a given substrate, and/or the effective spacing between adjacent leads can be reduced to accommodate an obstruction in the PWB while maintaining crosstalk at or below tolerable levels.

In a preferred embodiment, portions of the leads on the PWB are surface mounted leads and other portions are grooved path leads. The grooved path lead portions are positioned proximate an obstruction contained in the PWB so that effective spacings between the grooved path lead portions can be reduced to accommodate the obstruction.

Other objects and features of the present invention will become apparent from the following detailed description considered in conjunction with the accompanying drawings. It is to be understood, however, that the drawings are designed solely for purposes of illustration and not as a definition of the limits of the invention, for which reference should be made to the appended claims. It should be further understood that the drawings are not necessarily drawn to scale and that, unless otherwise indicated, they are merely intended to conceptually illustrate the structures and procedures described herein.

BRIEF DESCRIPTION OF THE DRAWINGS

In the drawings, wherein like reference characters denote similar elements throughout the several views:

FIG. 1b is a partial cross-sectional view of the PWB of FIG. 1a;

FIG. 2 is a partial cross-sectional view of a PWB in accordance with the present invention;

FIG. 3 is a partial prospective view of the PWB of FIG. 2;

FIG. 4 is a cross-sectional view of the PWB of FIG. 3 taken along the lines 4—4.

DETAILED DESCRIPTION OF THE PRESENTLY PREFERRED EMBODIMENTS

Figure 1A:
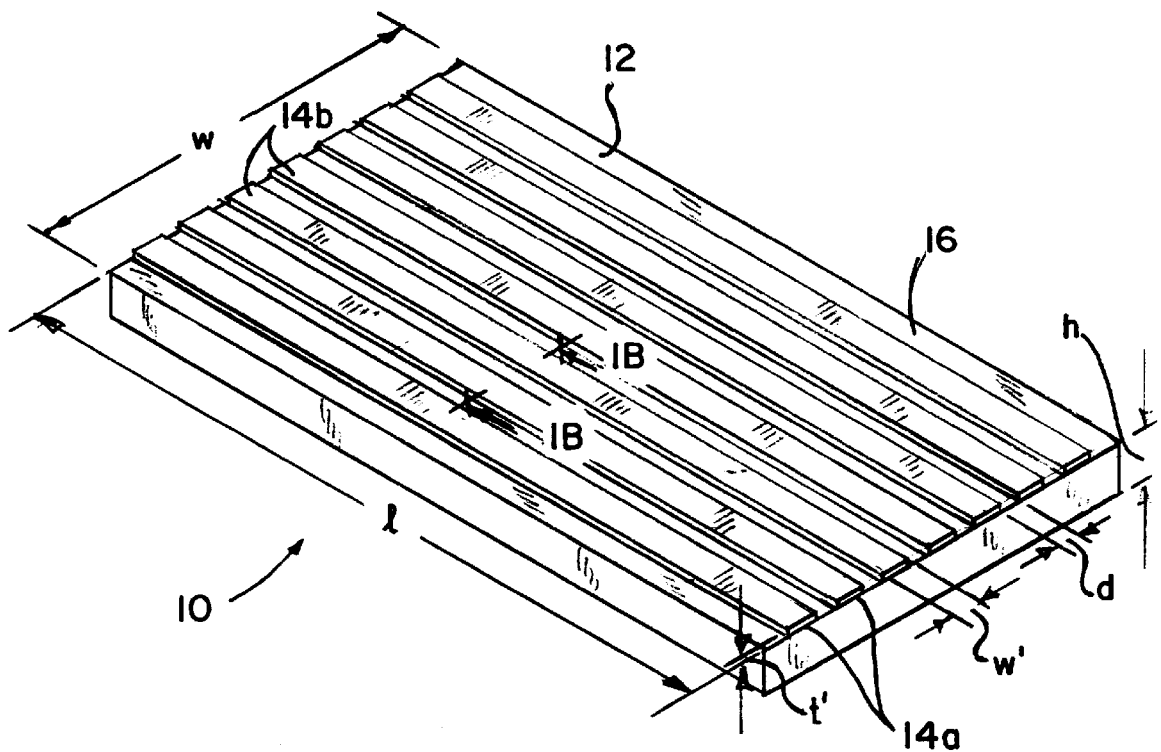
FIG. 1a is a perspective view of a prior art PWB.

FIGS. 1a and 1b depict a prior art PWB 10. As there shown, PWB 10 includes a substrate 12 constructed of non-conducting material, such as plastic, etc. and having a length 1, a width w, a thickness or height h, and an upper surface 16. PWB 10 contains a plurality of conductive lead pairs 14 (only two pairs being labelled, as 14a and 14b) which are formed on upper surface 16. Each lead pair 14 contains a Tip lead and a Ring lead, with each lead having a thickness t and occupying a portion of the substrate upper surface area defined by 1×w', where w' is the width of each lead as shown in FIGS. 1a and 1b. The volume of each lead 14 is thus calculated as 1×t×w' and dictates the signal carrying capacity of the lead.

A major consideration in PWB design is the presence of crosstalk or interference that a first lead pair may exert on a second lead pair. Such crosstalk results from the proximate physical location of lead pairs with respect to each other and more particularly, from the magnetic coupling of electric signals carried by the leads. For example, the distance between the closely spaced leads of lead pairs 14a and 14b is shown as d in FIGS. 1a and 1b. As this distance d decreases such as when many lead pairs are carried on a common substrate 12, more crosstalk will result. When distance d is increased, as where only a few lead pairs are carried on substrate 12, crosstalk will be minimized at the expense, however, of the inefficient use of substrate surface area 16. Moreover, when an obstruction—such as a mounting location or cavity for accommodating insertion of a mounting fastener for securing the PWB to a surface—must be included, a portion of the PWB surface area must be utilized for this purpose, thus minimizing the surface area available for conductive leads. As a result, the spacings surrounding the area of the obstruction must be condensed to accommodate the obstruction, thereby resulting in an increased level of crosstalk.

To alleviate the problem of increased crosstalk between leads in proximate location to an obstruction contained on a printed wiring board, applicant has devised a conductive lead configuration that allows for a reduction in spacing between adjacent leads while preventing an increase in crosstalk. This enhanced lead design is incorporated in the modified printed wiring board 10' of FIG. 2. As there shown, modified PWB 10' contains grooves or channels 18 formed in substrate 12. Channels 18 preferably include side walls 30, 32 and a bottom wall 34, and have a particular width w" and height h". The channels can be formed in any known manner such as by lasers, sawing, etc. After channels 18 are formed, the channel walls 30, 32 are covered or coated with a conducting material, such as aluminum, etc., to form leads 14a' and 14b" having a thickness t'. Leads 14a" and 14b" may be formed in any known manner such as by coating or spraying grooved paths 18 with a metal. Bottom wall 34 may optionally also be coated with a conducting material having a thickness t'. The conducting material on the coated walls (i.e. either side walls 30, 32 or the side walls and the bottom wall 34) are connected together to form a single conductor for each grooved path 18.

By so forming these grooved paths 18 and coating the walls thereof with a conductive material, the entire surface areas of the coated grooved paths are available for carrying an electrical signal across a PWB. Moreover, minimal PWB upper surface area is required because the width w" of the grooved paths 18 may be narrower than the width w of a conventional surface mounted lead of the type depicted in FIGS. 1a and 1b. In addition, the thickness t' of each grooved path coated wall may be less than the thickness t of the prior art while still maintaining or increasing the conductive volume and thus, the signal carrying capacity of the PWB.

As a further example and as noted above, a certain minimum volume of conductive material is needed to carry electrical signals at a desired rate. For a surface mounted lead, the volume is calculated by 1×w×t, where 1 is the length of the lead, w is the lead width and t is the lead height or thickness. For a grooved path lead 14a' as shown in FIG. 2, however, the volume of the lead material for a grooved path lead wherein the lead is contained on two side walls is 21×h"×t, where 1 is the length of each side wall lead in the groove, t is the thickness of the lead, and h" is the depth of the groove 18 into substrate 12. Note that for a given or constant length, the ratio or difference between a surface mounted lead to a grooved path lead is t×w for a surface lead and 2t×h" for a side wall coated lead. If the groove width w" is equal to the groove depth h", and if conductive material is applied to the side walls 30, 32 and the bottom wall 34, then the lead volume is calculated as 3t×w". As should therefore be appreciated, by forming leads 14a' and 14b40 in grooved paths 18 there is, in effect, more surface area for conductive material, e.g. on the walls and floor of groove 18. In a preferred embodiment, the grooved path width w" is narrower than the width w' of surface lead 14a shown in FIG. 1b; as a result, the surface spacing d' between adjacent lead pairs 14a' and 14b' of the PWB of FIG. 2 will be greater—assuming the same number of leads on the PWB—than the surface spacing d between surface mounted leads 14a and 14b on the PWB of FIG. 1b, reducing the amount of crosstalk. Alternatively, the required size of the PWB can be reduced, or additional leads accommodated in the PWB, by using the same spacing employed in prior art PWBs.

Although the grooved paths 18 are depicted as having a rectangular cross sectional area, it will be readily appreciated by those having ordinary skill in the art that grooved paths 18 may be formed with a "V" shaped cross section or an arcuate or curved or selectively varied cross section, or some combination thereof, without departing from the spirit and intended scope of the present invention. Regardless of the shape of the grooved paths 18, the present invention can be used to construct a PWB having improved lead density, e.g. an increased number of leads for a given substrate size, thus permitting an increased number of parallel signals to be carried to an increased number of terminal devices.

A particularly advantageous benefit of the present invention will now be described with reference to FIGS. 3–5. FIG. 3 depicts a section of a PWB containing a combination or hybrid lead having a surface mounted portion 14a and grooved path portion 14a', with an overlap region 24 between the surface mounted lead 14a and the groove path lead 14a'. The overlap region provides for contact or connection between the surface mounted lead portion and the grooved path lead portion to allow an electrical signal to travel therebetween.

Figure 5:
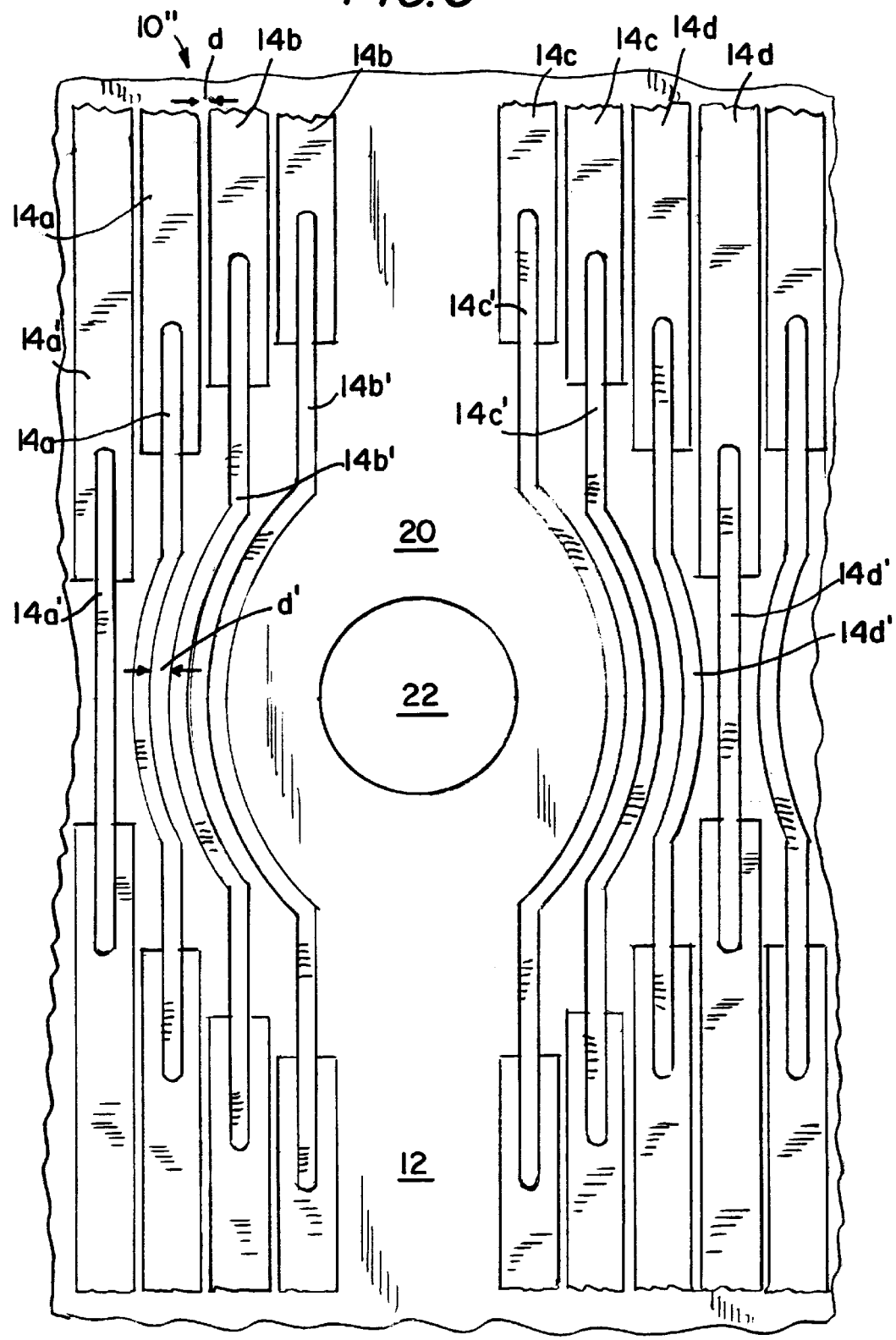
FIG. 5 is a top plan view of a PWB in accordance with another embodiment of the present invention containing an obstruction.

Shown in FIG. 5 is a printed wiring board 10" containing four lead pairs 14a–d with each pair having a Tip and a Ring lead. Each lead pair includes a respective surface mounted portion 14a, 14b, 14c and 14d and a respective grooved path portion 14a', 14b', 14c' and 14d'. Printed wiring board 10" contains an obstruction area 20 formed in substrate 12 and in or at which an obstruction 22 is located. Obstruction 22 may for example be an IC, component, or a hole for accommodating insertion of a mounting bracket or screw (not shown) for securing the printed wiring board 10" to a surface, as is known in the art. Due to the presence of obstruction 22, the leads 14 must be arranged to bypass the obstruction 22 without causing interference or degradation to an electrical signal carried across PWB 10". By utilizing grooved path sections in accordance with the present invention, the spacings between adjacent lead pairs and, in particular, the spacings d' between adjacent grooved path lead pairs 14a' and 14b' can be appropriately sized to accommodate obstruction 22 while maintaining crosstalk at or below tolerable levels. As a result, obstructions can be incorporated on standard sized PWB substrates without reducing the number of lead pairs that can be carried and without causing an increase in crosstalk.

Thus, while there have shown and described and pointed out fundamental novel features of the invention as applied to preferred embodiments thereof, it will be understood that various omissions and substitutions and changes in the form and details of the devices illustrated, and in their operation, may be made by those skilled in the art without departing from the spirit of the invention. For example, it is expressly intended that all combinations of those elements which perform substantially the same function in substantially the same way to achieve the same results are within the scope of the invention. It is the intention, therefore, to be limited only as indicated by the scope of the claims appended hereto.

What is claimed is:

1. A printed wiring board (PWB) for carrying electric signals, comprising:

a substrate constructed of an insulating material, said substrate having an outer surface;

a first groove defined in and along said substrate outer surface and having a length and a side wall;

a first layer of conductive material disposed on said first groove side wall for forming a first electric lead for carrying a first electric signal along the length of said first groove; and an external layer of conductive material disposed on the outer surface of said substrate and in contact with said first layer of conductive material disposed on said first groove side wall for forming a hybrid lead having a surface mounted portion comprising said external layer and a groove path portion comprising said first layer of conductive material disposed on said first groove side wall for carrying the first electric signal along said hybrid lead.

2. The PWB of claim 1, further comprising a second groove defined in and along said substrate outer surface and spaced from said first groove so that a section of the substrate is disposed between said first and second grooves, said second groove having a length, a side wall, and a second layer of conductive material disposed on said second groove side wall for forming a second electric lead for carrying a second electric signal along the length of said second groove, said substrate section providing insulation between said first and second electric leads for reducing crosstalk between the first and second electric signals.

3. The PWB of claim 2, wherein each of said first and second grooves comprises respective first and second side walls, wherein said first layer of conductive material is disposed on each of said first and second side walls of said first groove, and wherein said second layer of conductive material is disposed on each of said first and second side walls of said second groove.

4. The PWB of claim 3, wherein each of said first and second grooves further comprises a bottom wall, and wherein said first layer of conductive material is disposed on the bottom wall of said first groove, and wherein said second layer of conductive material is disposed on the bottom wall of said second groove.

5. The PWB of claim 1, further comprising an obstruction formed in said substrate, and wherein said groove path portion of said hybrid lead is positioned proximate said obstruction.

* * * * *